United States Patent
Liu et al.

(10) Patent No.: US 9,704,711 B2
(45) Date of Patent: Jul. 11, 2017

(54) SILICON-BASED MIDDLE LAYER COMPOSITION

(71) Applicant: Taiwan Semiconductor Manufacturing Company, Ltd., Hsin-Chu (TW)

(72) Inventors: Chen-Yu Liu, Kaohsiung (TW); Ching-Yu Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 14/671,696

(22) Filed: Mar. 27, 2015

(65) Prior Publication Data

US 2016/0284537 A1 Sep. 29, 2016

(51) Int. Cl.
*H01L 21/31* (2006.01)
*H01L 21/033* (2006.01)
*H01L 21/027* (2006.01)
*H01L 21/02* (2006.01)

(52) U.S. Cl.
CPC ...... *H01L 21/0332* (2013.01); *H01L 21/0271* (2013.01); *H01L 21/02126* (2013.01)

(58) Field of Classification Search
CPC ............ H01L 21/0332; H01L 21/3081; H01L 21/0274; H01L 21/02216
USPC ................................................. 438/761, 778
See application file for complete search history.

(56) References Cited

U.S. PATENT DOCUMENTS

| | | | |
|---|---|---|---|
| 7,473,749 B2 * | 1/2009 | Ito | G03F 7/11 430/270.1 |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,647,809 B2 * | 2/2014 | Sullivan | C08G 77/58 430/270.1 |
| 8,658,344 B2 | 2/2014 | Wang et al. | |
| 8,715,919 B2 | 5/2014 | Chang et al. | |
| 8,741,551 B2 | 6/2014 | Wu et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2014/0363955 A1 * | 12/2014 | Hatakeyama | H01L 21/266 438/514 |

(Continued)

FOREIGN PATENT DOCUMENTS

TW 201337466 9/2013

*Primary Examiner* — S. V. Clark
(74) *Attorney, Agent, or Firm* — Haynes and Boone, LLP

(57) ABSTRACT

A method of making a semiconductor device is provided. The method includes forming a first material layer that includes a silicon-based component having an alkyl group on a substrate, forming a photoresist layer directly on the material layer, and exposing the photoresist layer to a radiation source.

20 Claims, 4 Drawing Sheets

(56) References Cited

U.S. PATENT DOCUMENTS

2016/0187782 A1\* 6/2016 Hustad ................ H01L 21/0274
 438/703

\* cited by examiner

SILICON-BASED MIDDLE LAYER COMPOSITION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As lithographic features are reduced, for example, to below 40 nanometers (nm), high numerical aperture processes are needed to overcome the resolution limit. In this regard, the use of a trilayer photoresist films scheme appears to be advantageously promising. Specifically trilayer photoresist films can provide for improvements in line edge roughness (LER) and line width roughness (LWR) among other benefits.

Using trilayer schemes however raises challenges, especially with the decreasing technology nodes and pitch provided between features. The decreasing feature size and pitch can lead to collapse of photoresist features. This collapse may be due to the deterioration of adhesion and/or unintentional impurities between the top photoresist layer and the middle layer of the trilayer scheme. Thus, a process and material that reduces, minimizes or removes problems with a patterning material is desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
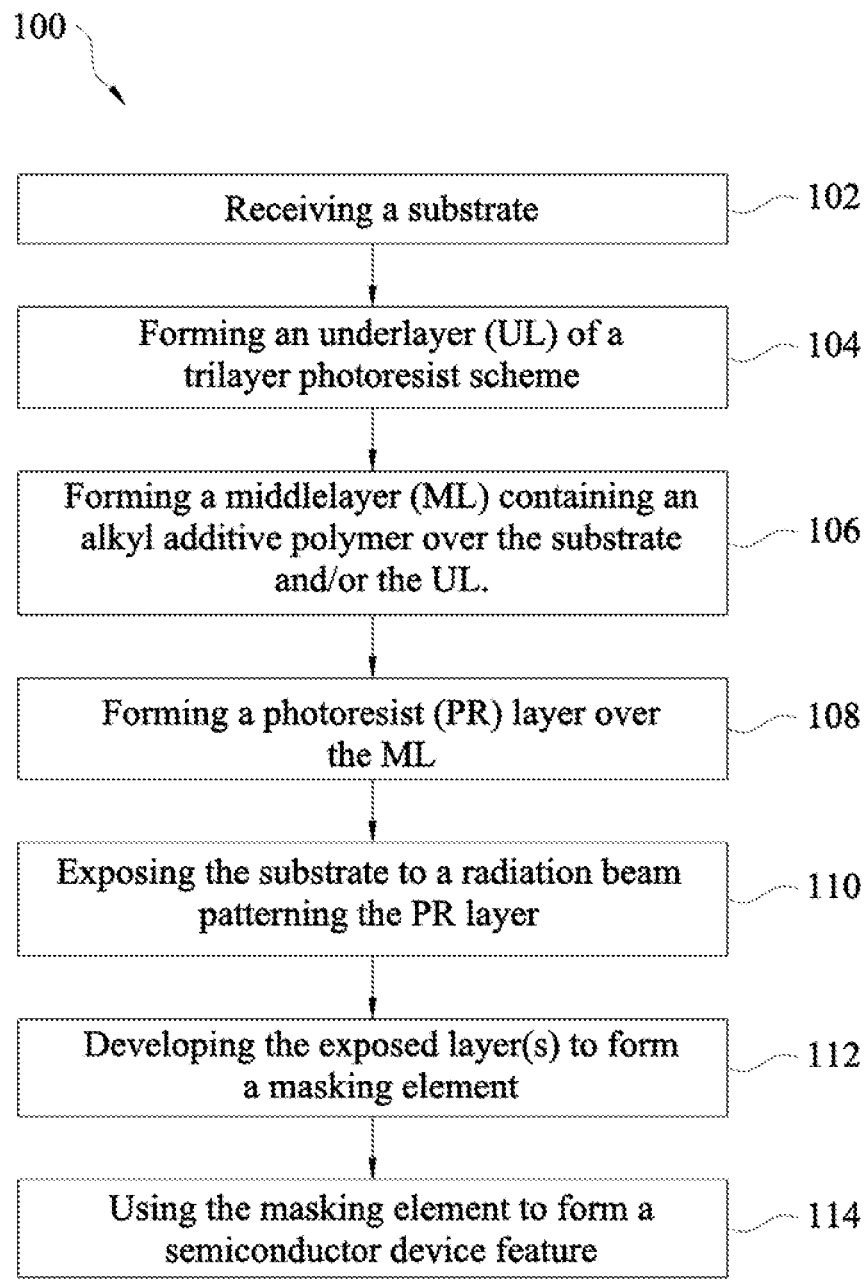
FIG. 1 is a flowchart of an embodiment of a method for making a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of one embodiment of a method 100 of making a semiconductor device according to aspects of the present disclosure. FIGS. 2-5 are cross-sectional views of a semiconductor fabricated according to one or more steps of the method 100. It is understood that the method 100 includes steps having features of a complementary metal-oxide-semiconductor (CMOS) technology process flow and thus, are only described briefly herein. Additional steps may be performed before, after, and/or during the method 100.

It is also understood that parts of the semiconductor device 200 may be fabricated by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure.

The device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The semiconductor device 200 includes a plurality of semiconductor devices (e.g., transistors), which may be interconnected.

The method 100 begins at step 102 by receiving a substrate. The substrate may be a semiconductor substrate, such as a semiconductor wafer. The substrate may include silicon in a crystalline structure. In alternative embodiments, the substrate may include germanium, silicon germanium, silicon carbide, gallium arsenide, indium arsenide, indium phosphide, and/or other suitable materials. The substrate may be a silicon-on-insulator (SOI) substrate. The substrate may include a plurality of layers and/or features formed on the semiconductor substrate including doped regions or wells, isolation regions such as shallow trench isolation (STI) features, conductive layers, insulating layers, and various other suitable features. For example, the substrate may include one or more target layers, which are desired to be patterned. Referring to the example of FIG. 2, a substrate 202 is illustrated. In accordance with some illustrative embodiments, the substrate 202 has any plurality of layers (conductive layer, insulator layer) or features (source/drain regions, gate structures, interconnect lines and vias), formed thereon. The substrate 202 may include one or more target layers disposed on a semiconductor substrate; the target layers suitable for patterning by the method 100. Exemplary target layers include gate layers, interconnect layers, and/or other suitable layers. In an embodiment, the patterning by the method 100 may be suitable for etch portions of the semiconductor substrate itself (e.g., such as in the formation of fins for a fin-type field effect transistor).

The method 100 continues in block 104 wherein an underlayer (UL) (or first layer) of a trilayer patterning stack is formed on the substrate. The underlayer may be a first (e.g., nearest the substrate) layer of a trilayer patterning stack also referred to as a tri-layer photoresist. In an embodiment, the underlayer is organic. In a further embodiment, the organic material includes a plurality of monomers or polymers that are not cross-linked. Generally, the underlayer layer may contain a material that is patternable and/or have a composition tuned to provide anti-reflection properties. Exemplary materials for the underlayer include a carbon backbone polymer. In an embodiment, the underlayer is omitted. In some embodiments, the underlayer may be formed by a spin coating process. In other embodiments, the underlayer may be formed by another suitable deposition process.

Figure 2:
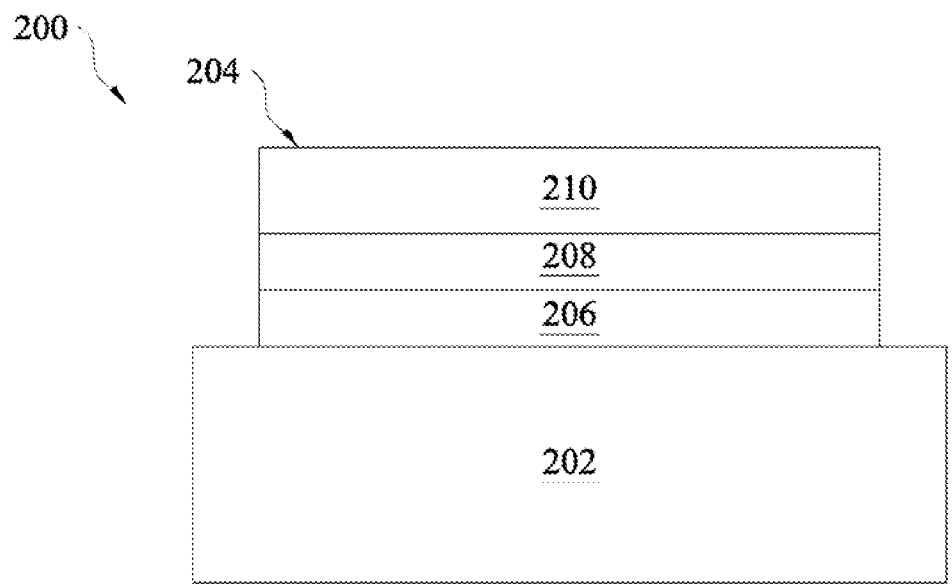
FIGS. 2-5 are diagrammatic fragmentary cross-sectional side views of an embodiment of a semiconductor device according to various aspects of the present disclosure.

Referring now to FIG. 2, a trilayer patterning stack 204 is disposed on the substrate 202. The trilayer patterning stack 204 includes underlayer 206. In an embodiment, the underlayer 206 is a carbon backbone polymer.

Referring to FIGS. 1 and 2, method 100 then proceeds to block 106 with forming a middle layer 208 (or second layer) over the substrate and/or the underlayer 206. The middle layer may be a second layer of a trilayer patterning stack. Generally, the middle layer may have a composition that provides an anti-reflective properties and/or hard mask properties for the lithography process. In an embodiment, the middle layer includes a silicon containing layer (e.g., silicon hard mask material). The middle layer may include a silicon-containing inorganic polymer. In a further embodiment, the middle layer includes a siloxane polymer (e.g., a polymer having a backbone of O—Si—O—Si— etc.). The silicon ratio of the siloxane polymer may be controlled such as to control the etch rate of the middle layer. For example, the silicon ratio of the siloxane polymer may be a value between about 10% to about 45%. More particularly, the molecular weight of siloxane polymer may reside between about 1000 g to about 8000 g. In some alternative embodiments, the middle layer may include silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer may be thermally baked for cross-linking, thus without further requiring a solvent. In some embodiments, the middle layer does include a solvent, such as PGEE (1-ethoxy-2-pranol), PGMEA (propylene glycol methyl ether acetate), water, or a combination thereof. For any or all of these compositions of the middle layer, an additive may be added (mixed or blended therewith) to enhance the middle layer. This additive is discussed further below.

In accordance with some illustrative embodiments, the middle layer may include additives that may cause the middle layer to affect the contact angle and other properties of the middle layer's interface with an overlying photoresist layer (such as discussed below with reference to step 108). Some of these additives may advantageously provide enhancements in the interface between layers such as provided by hydrophilic-to-hydrophilic forces or hydrogen bonding.

For example, the additive of an alkyl group may be therefor used to tune the hydrophobicity of the middle layer 208. Further, the concentration of the additive alkyl group may be adjusted to perform such goal (i.e., tuning the hydrophobicity of the middle layer). Generally, the more the concentration of the alkyl group in the middle layer, the less hydrophobic (less oil-like) the middle layer 208. As such, including the alkyl group in the middle layer may decrease the contact angle mismatch between the photoresist layer and the middle layer. A more hydrophobic middle layer improves adhesion of the middle layer to the photoresist layer to improve photoresist pattern peeling. Reduced pattern peeling translates to sharper and more distinct features in the semiconductor device 200. Also, the increased hydrophobicity of the middle layer prevents hydrophilic developer solutions from penetrating the middle layer and causing collapse of the photoresist pattern during development of the photoresist layer. However, the increased hydrophobicity of the middle layer may also cause an impurity, such as a direct self-assembling (DSA) aggregation, on the surface of the middle layer. Such DSA aggregation may occur at any stage during preparation of the middle layer, but in particularly it occurs more frequently during a cross-linking process. The formation of the DSA aggregation is generally due to a significant difference of hydrophobicity between a monomer of the middle layer (e.g., a siloxane polymer) and a cross-linking reagent. The cross-linking process may include mixing the siloxane polymer with the crosslinking reagent, baking the mixture to form a crosslinked monomer/polymer, etc. Thus, in order to reach an optimal contact angle and hydrophobicity for a desirable purpose, the concentration of the alkyl group may be suitably chosen.

In accordance with various embodiments, the middle layer 208 includes a composition that may advantageously avoid an impurity (e.g., a DSA aggregation) to be formed between the middle layer and the overlying photoresist after a baking process. More specifically, the middle layer 208 includes an additive compound or component such as an alkyl group. This additive alkyl group increases the hydrophobicity of the middle layer so as to decrease a difference of hydrophobicity between the monomer of the middle layer and the cross-linking reagent.

In an embodiment, the middle layer includes a composition, for example, a polymer having an alkyl group attached thereto. Alternatively or additionally, the polymer may include cyclic ring, norbornane, benzene, adamantine, and/or other suitable structures.

The middle layer may be formed by a spin-on coating process, chemical vapor deposition process (CVD), physical vapor deposition (PVD) process, and/or other suitable deposition processes.

Referring to the example of FIG. 2, middle layer 208 is disposed on the underlayer 206 as one component of the trilayer patterning stack 204. The middle layer 208 may include a suitable material such as a hard mask material having an additive component such as an alkyl group. For example, in an embodiment, the middle layer 208 includes a siloxane polymer blended or mixed with an additive component (e.g., an alkyl group). In another embodiment, the additive component may be a composition (e.g., polymer) including a plurality of alkyl groups. Further, such alkyl-added siloxane polymer may be cross-linked by using a cross-linking reagent, and may be cross-linked to form any kind of shapes, such as a chain, a web, a circle, a comb, a star, etc. The alkyl-added siloxane polymer middle layer 208 is described in further detail with reference to FIGS. 6 and 7.

Referring to FIGS. 1 and 2, method 100 then proceeds to block 108 where a photoresist (PR) layer 210 is formed over the middle layer 208. The photoresist layer may be a third, and top, layer of a trilayer patterning stack. The photoresist layer may be a photosensitive layer operable to be patterned by a radiation as known in the art. Typically, the chemical properties of the photoresist regions struck by incident radiation change in a manner that depends on the type of photoresist used. In an embodiment, the photoresist layer is a suitable positive tone resist. Positive tone resist refers to a photoresist material that that when exposed to radiation (typically UV light) becomes insoluble to a negative tone developer, while the portion of the photoresist that is non-exposed (or exposed less) becomes soluble to the negative tone developer. The term "negative tone developer" may refer to any suitable developer that selectively dissolves and removes areas that received no exposure dose or an exposure dose below a predetermined threshold exposure dose value. The negative tone developer may include an organic solvent. The organic solvent can comprise a solvent such as, for example, a ketone-based solvent, ester-based solvent, alcohol-based solvent, amide-based solvent, ether-based solvent, hydrocarbon-based solvent, and/or other suitable solvent. As discussed below, the solubility provides for forming a patterned photoresist layer.

The photoresist layer 210 may include a carbon backbone polymer. The photoresist layer 210 may include other suitable components such as a solvent and/or photo acid generators. For example, in a further embodiment, the photoresist layer is a chemical amplified (CA) resist known in the art. The photoresist layer may include a photo-acid generator (PAG) distributed in the photoresist layer. When absorbing photo energy from an exposure process, the PAG forms a small amount of acid. The resist may include a polymer material that varies its solubility to a developer when the polymer is reacted with this generated acid. The CA resist may be a positive tone resist. Examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs now known or later developed.

Referring to FIG. 1, the method 100 then proceeds to block 110 where the substrate is exposed to a radiation beam thereby patterning the photoresist layer. The radiation beam may expose the resist deposited on the substrate using a lithography system that provides a pattern of the radiation according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system.

Figure 3:
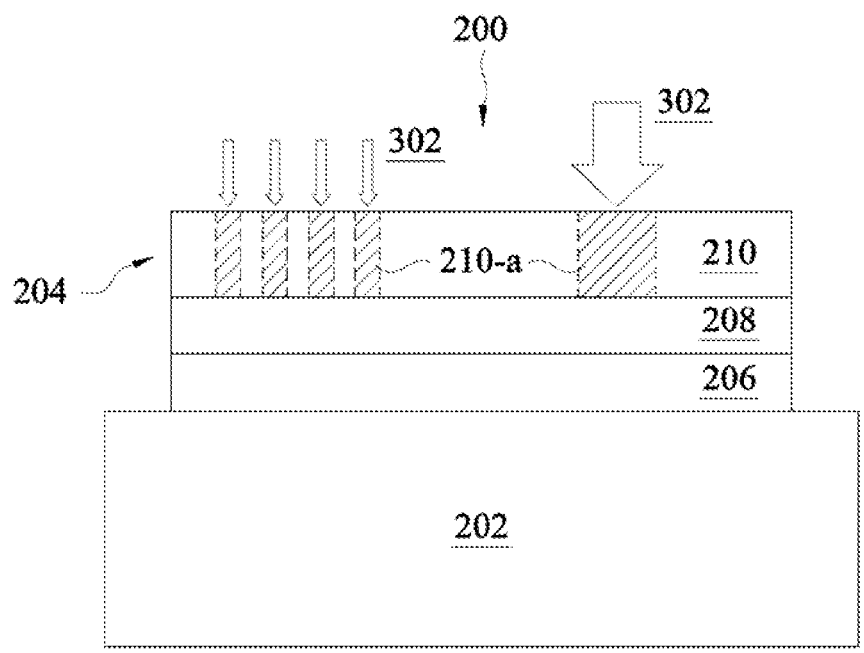

Referring to the example of FIG. 3, a patterned radiation beam 302 incidents the substrate 202 and specifically the photoresist layer 210. The regions 210*a* illustrate the portions of the resist that have been exposed to the radiation, and thus, a chemical change has occurred in those reasons. In the case of negative resist, the regions 210*a* are insoluble in developer. In some alternative embodiments, if the middle layer 208 includes an additive compound or component having a photo base generator (PBG), the radiation beam 302 may also incur a chemical change within the middle layer 208. For example, the PBG of the middle layer may generate a base upon exposure to the radiation.

In embodiments of the method 100, after the exposure process, a baking process may occur. The bake may be a hard bake. In an embodiment, the photoresist layer is a chemically amplified resist (CAR) and the bake process serves improve the insolubility. After or during this bake process, the residual base of the middle layer may react with a component of the photoresist layer to form a linkage or bond there between. In an embodiment, this linkage is a covalent bond. In one embodiment, the residual generated base reacts with an acid labile group (ALG) generated and/or provided in the photoresist layer. In a further embodiment, an acid labile group (ALG) is generated by the resist after exposure. Thus, in an embodiment, the residual base left in the middle layer after quenching the acid of the photoresist generated by the exposure, can react with the photoresist ALG to form a covalent bond linker. This may improve the adhesion between the photoresist layer and the middle layer in the exposed regions.

The method 100 then proceeds to block 112 where the exposed layer(s) are developed to form a masking element. A developer may be applied to the exposed resist to form a resist pattern on the substrate.

In an embodiment, a negative tone developer is applied in block 112. The term "negative tone developer" refers to a developer that selectively dissolves and removes areas that received no exposure dose (or an exposure dose below a predetermined threshold exposure dose value).

In an embodiment, a developer may include an organic solvent or a mixture of organic solvents, such as methyl a-amyl ketone (MAK) or a mixture involving the MAK. In another embodiment, a developer includes a water based developer, such as tetramethylammonium hydroxide (TMAH). Applying a developer includes spraying a developer on the exposed resist film, for example by a spin-on process. In an embodiment, the developer may remove the non-exposed regions of the resist leaving the portions have been exposed. It is noted that in an embodiment, the covalent bond between the photoresist layer and the middle layer is provided in only in this region having radiation incident thereto. This region may be the region of the photoresist layer (e.g., positive resist) that is insoluble to a developer such as a negative tone developer, discussed above.

Figure 4:
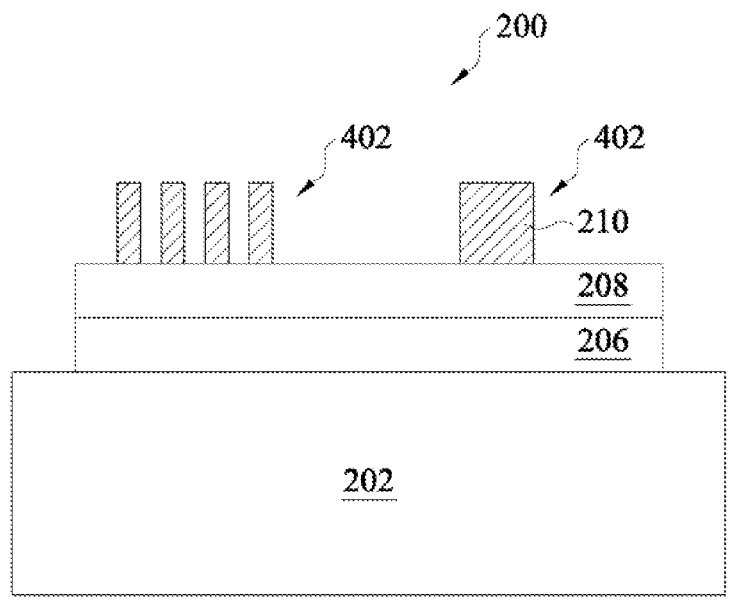
Figure 5:
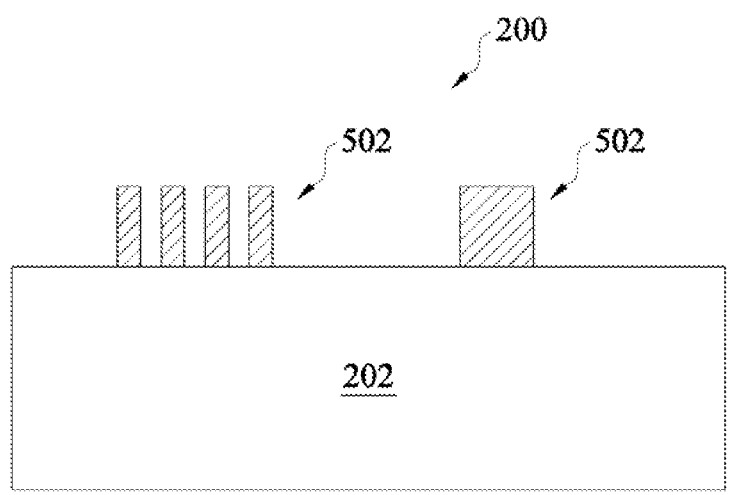

Referring to the example of FIG. 4, a masking element 402 is provided in the photoresist layer 210. In some embodiments, the masking element 402 may be formed by applying a negative tone developer to the exposed photoresist layer 210 such that the unexposed areas of photoresist layer 210*a* are removed.

In an embodiment, the masking element 402 is used to etch the middle layer 208. In turn, the etched middle layer 208 may be used as a masking element to pattern additional layers. In other embodiments or further embodiments, one or more of the layers on the substrate 202 may also be patterned using subsequent etching processes such as dry etching or plasma etching based on the pattern provided by the masking elements 402. The masking element 402 may be insoluble to a negative tone developer.

The method 100 then proceeds to block 114 where a masking element is used to form a semiconductor device feature. In an embodiment, the masking element includes one or more of the photoresist layer, the middle layer, and the underlayer. In a further embodiment, the photoresist layer is stripped after transferring the pattern to the middle layer (by suitable etching process discussed above). The patterned middle layer may then be used as the masking element to pattern additional layer(s), such as the under layer. Referring to the example of FIG. 5, features 502 are formed of a target layer of the substrate 202. In some embodiments, features 502 may be formed of one or more of the photoresist layer 210, the middle layer 208, and the under layer 206. The features 502 are defined by the masking element 402 (see FIG. 4). Features 502 may be gate structures, fin structures such as provided in a fin-type field effect transistor, interconnect structures, isolation features, conductive features such as lines, and/or other suitable semiconductor device features.

The method 100 may continue with further steps not specifically described herein but understood by one of ordinary skill in the art. For example, the semiconductor device 200 may next be subjected to a rinsing process, such as a de-ionized (DI) water rinse. The rinsing process may remove residue particles.

Figure 6:
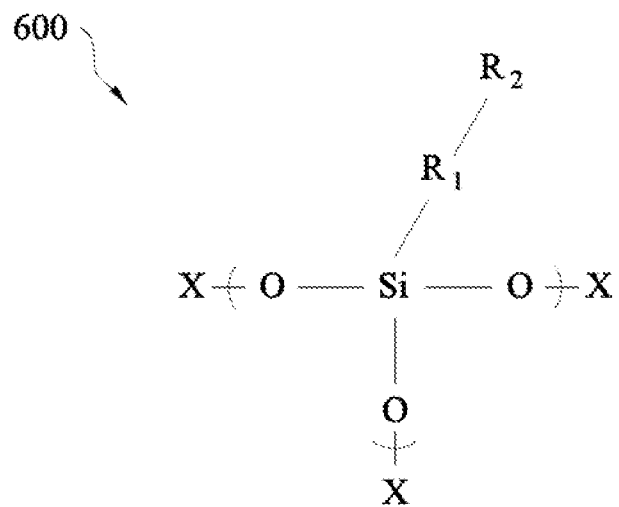
FIG. 6 illustrates an exemplary chemical structure of a composition of a middle layer that includes an additive material according to various aspects of the present disclosure.
Figure 7:
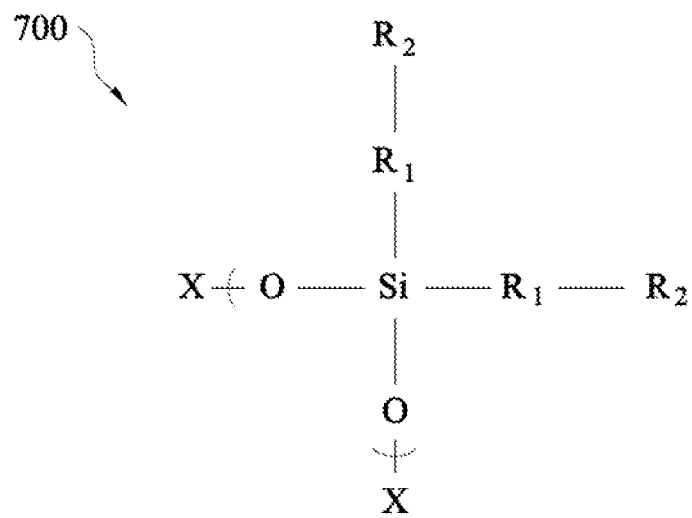
FIG. 7 illustrates another exemplary chemical structure of a composition of a middle layer that includes an additive material according to various aspects of the present disclosure.

FIGS. 6 and 7 provide exemplary structures 600 and 700 of a suitable monomer that is included in the middle layer in accordance with various embodiments. As described above, the monomer may be an alkly-added siloxane polymer. Referring to FIGS. 6 and 7, the structures include a silicon backbone (O—Si—O—Si— etc.), R1(s) and R2(s). In some embodiments, "R1" represents an alkyl group having 1 to 10 carbon atom(s), and "R2" represents an organic group having a hydroxyl group, a carboxylic acid group, an amine group or any combinations thereof. "X" represents any kind of suitable component or group, such as another kind of monomer, a cross-linking reagent, etc, to be coupled to the siloxane polymer.

In some embodiments, the alkly-added siloxane polymer 600 and 700 shown in FIGS. 6 and 7 may be cross-linked by mixing, blending, and/or baking with a cross-linking reagent. During or after forming application of the middle layer 208, the alkyl-added siloxane polymer may periodically link with the cross-linking reagent. Referring to FIG. 6, each of the three Xs may be linked to a cross-linking reagent, and each of the linked cross-linking reagent may be further linked to a 600 or 700. As such, a uniform polymer may be formed with periodic arrangement of the cross-linking reagent and the alkyl-added siloxane polymer. In other words, if an uniform middle layer is formed (that is, no or lesser DSA aggregation(s) formed on the top surface of the middle layer), an optimal contact angle of the subsequent formation of the photoresist layer and/or a better adhesion of the photoresist layer to the middle layer may be advantageously provided.

Various advantages may be present in one or more embodiments of the methods, devices and compositions described herein. The present disclosure provides a new material for a middle layer in a trilayer patterning stack. Embodiments of these materials and methods using them, can improve photoresist pattern peeling by providing improved adhesion between layers of a stack. Further, embodiments of these materials and methods can also avoid formation of a DSA aggregation. As such, disclosed materials and methods may provide more accurate patterning, sharper pattern resolutions, lowered rework or scrap rates, and/or other benefits. The improved adhesion is provided by changing the hydrophobicity of a monomer of the middle layer so as to decrease a difference of hydrophobicity between the monomer of the middle layer and the cross-linking reagent.

The present disclosure provides a method and gate stack of a FET that includes a trilayer so as to provide improved adhesion between layers of a stack and decrease an occurrence of an impurity while forming said trilayer. In an embodiment, a method includes forming a first material layer that includes a silicon-based component having an alkyl group on a substrate, forming a photoresist layer directly on the material layer, and exposing the photoresist layer to a radiation source.

In another embodiment, a method of making a semiconductor device includes forming an under layer on the semiconductor substrate, forming a middle layer over the under layer, wherein the middle layer comprises a silicon-based monomer that includes an alkyl group, forming a photoresist layer over the middle layer, and providing a radiation beam incident the photoresist layer.

Still in another embodiment, a material stack utilized in photolithography patterning includes an under layer having an organic polymer, a middle layer having a silicon-containing polymer and an alkyl group linked to a silicon atom of the polymer, and a photoresist layer on the middle layer, wherein the photoresist layer includes a photosensitive material.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a first layer that includes a silicon-based component having an alkyl group on a substrate;
   forming a photoresist layer directly on the first layer;
   exposing the photoresist layer to a radiation source; and
   performing a baking process on the semiconductor substrate prior to forming the photoresist layer directly on the first layer.

2. The method of claim 1, further comprising:
   forming a material layer over the substrate prior to forming the first layer on the substrate.

3. The method of claim 1, wherein the silicon-based component is a polymer formed of a siloxane backbone.

4. The method of claim 3, wherein a composition to which a silicon atom of the siloxane backbone links is an alkyl group.

5. The method of claim 4, wherein a composition to which the alkyl group links is one of a hydroxyl group, carboxylic acid group, or an amine group.

6. The method of claim 1, wherein the silicon-based component is a polymer formed of a siloxane backbone and has two alkyl groups.

7. The method of claim 6, wherein the two alkyl groups link to a silicon atom of the siloxane backbone.

8. The method of claim 7, wherein each of the two alkyl groups links to one of a hydroxyl group, carboxylic acid group, and an amine group.

9. The method of claim 1, further comprising:
   after exposing the photoresist layer, developing the exposed photoresist layer to form a patterned photoresist layer; and
   using the patterned photoresist layer to etch a material layer disposed on the substrate.

10. The method of claim 1, wherein the alkyl group includes a number of carbon atom that ranges from 1 to 10.

11. The method of claim 1, wherein the silicon-based component includes a ratio of silicon atom between 10% to 45%.

12. A method of making a semiconductor device, the method comprising:
   forming an under layer on the semiconductor substrate;
   forming a middle layer over the under layer, wherein the middle layer comprises a silicon-based monomer that includes an alkyl group, wherein the silicon-based monomer is a polymer that includes a siloxane backbone;
   forming a photoresist layer over the middle layer; and
   providing a radiation beam incident the photoresist layer.

13. The method of claim 12, wherein the alkyl group links to a silicon atom of the silicon-based monomer.

14. The method of claim 13, wherein the linked alkyl group links to one of a hydroxyl group, carboxylic acid group, or an amine group.

15. The method of claim 12, wherein a silicon atom of the silicon-based monomer links to two alkyl groups.

16. The method of claim 15, wherein each of the two alkyl groups links to one of a hydroxyl group, carboxylic acid group, or an amine group.

17. A method of photolithography patterning, comprising:
   forming an under layer over a substrate;
   forming a middle layer over the under layer having a silicon-containing polymer and an alkyl group linked to a silicon atom of the polymer, wherein the silicon-containing polymer includes a siloxane backbone; and
   forming a photoresist layer on the middle layer, wherein the photoresist layer includes a photosensitive material.

18. The method of claim 17, wherein the middle layer includes two alkyl groups linked to a silicon atom of the polymer.

19. The method of claim 17, further comprising:
   exposing the photoresist layer to a radiation source; and
   developing the exposed photoresist layer with a negative tone developer to form a patterned photoresist layer.

20. The method of claim 1, further comprising developing the exposed photoresist layer with a negative tone developer to form a patterned photoresist layer.

* * * * *